United States Patent [19]

Zaitsu

[11] Patent Number: 5,341,061

[45] Date of Patent: Aug. 23, 1994

[54] PIEZOELECTRIC TRANSFORMER CIRCUIT USING A PIEZOELECTRIC TRANSFORMER UNIT OF A THICKNESS EXTENSIONAL VIBRATION MODE

[75] Inventor: Toshiyuki Zaitsu, Tokyo, Japan

[73] Assignee: NEC Corporation, Japan

[21] Appl. No.: 31,811

[22] Filed: Mar. 15, 1993

[30] Foreign Application Priority Data

Mar. 13, 1992 [JP] Japan .................... 4-055020

[51] Int. Cl.⁵ ............................. H01L 41/08
[52] U.S. Cl. .................... 310/318; 310/359; 310/366
[58] Field of Search ............. 310/316, 317, 318, 366, 310/358, 359

[56] References Cited

U.S. PATENT DOCUMENTS

| | | | |
|---|---|---|---|
| 2,943,278 | 6/1960 | Mattiat | 310/359 X |
| 2,974,296 | 3/1961 | Rosen | 310/359 |
| 2,975,354 | 3/1961 | Rosen | 310/359 X |
| 2,976,501 | 3/1961 | Mattiat | 310/359 X |
| 3,281,726 | 10/1966 | Schafft | 310/318 X |
| 3,487,239 | 12/1969 | Schafft | 310/359 |
| 3,489,931 | 1/1970 | Teaford | 310/359 |
| 3,598,909 | 8/1971 | Sasaki et al. | 310/318 |
| 3,736,446 | 5/1973 | Berlincourt et al. | 310/318 |
| 5,118,982 | 6/1992 | Inoue et al. | 310/366 |

OTHER PUBLICATIONS

Rosen, C. A., *Proceedings 1956 Electronic Components Symposium*, "Ceramic Transformers and Filters", May, 1956, pp. 205-211.

*Primary Examiner*—Mark O. Budd
*Attorney, Agent, or Firm*—Ostrolenk, Faber, Gerb & Soffen

[57] ABSTRACT

In a piezoelectric transformer circuit which is operable as a d.c./d.c. converter for a d.c. input voltage into a plurality of d.c. output voltages and which has a piezoelectric block divided into first and second partial blocks having first and second principal surfaces coated with first and second electrode units and a third electrode unit extended from the piezoelectric block between the first and the second electrode units, a selected one of the first and the second electrode units is divided into a plurality of subdivided electrodes. A plurality of a.c. output voltages are developed between each of the subdivided electrodes and the third electrode unit and are converted into the d.c. output voltages. Alternatively, the second partial block is composed of a plurality of piezoelectric layers stacked with one another via at least one intermediate electrode to derive a plurality of the a.c. output voltages between the third electrode unit and at least one intermediate electrode and between the third electrode unit and the second electrode which is not divided into subdivided electrodes. Furthermore, each of the first and the second electrode units is divided into main and subsidiary electrode members to develop an a.c. output voltage across the main electrode members and to induce a self-excited vibration by the use of the subsidiary electrode members.

8 Claims, 7 Drawing Sheets

PIEZOELECTRIC TRANSFORMER CIRCUIT USING A PIEZOELECTRIC TRANSFORMER UNIT OF A THICKNESS EXTENSIONAL VIBRATION MODE

BACKGROUND OF THE INVENTION

This invention relates to a piezoelectric transformer circuit which includes a piezoelectric transformer unit.

Heretofore, such a transformer unit has been proposed by C.A. Rosen in Proceedings of Electronic Components Symposium held in Washington, D.C., May 1, 2, 3, 1956 and makes use of a pair of polarized ferroelectric ceramic bars one of which is polarized in a direction of a thickness and the other of which is polarized in a longitudinal direction thereof and both of which are combined with one another. As well known in the art, when the one ceramic bar is driven by an a.c. voltage, the other ceramic bar is excited in a longitudinal vibration mode to induce a high output voltage because both the ceramic bars are electromechanically coupled to each other.

However, the transformer unit is disadvantageous in that a frequency characteristic are degraded frequency band, which inevitably makes the frequency characteristic narrow.

In order to improve the frequency characteristics, Inoue et al disclose a thickness mode vibration piezoelectric transformer unit in U.S. Pat. No. 5,118,982 assigned to the same assignee to the instant application. Such a thickness mode vibration piezoelectric transformer unit will be called a piezoelectric transformer unit hereinafter.

The proposed piezoelectric transformer unit comprises low and high impedance thickness mode vibration portions which are integrally laminated or stacked on each other. The high impedance portion is composed of a thick piezoelectric layer interposed between upper and lower electrodes while the low impedance portion is composed of a plurality of thin piezoelectric layers which are stacked from a lowermost one to an uppermost one and each of which is interposed between two electrodes. One of the electrodes that is attached to the lowermost thin piezoelectric layer is used in common to the upper electrode attached to the thick piezoelectric layer. In addition, the thick and the thin piezoelectric layers have thicknesses different from each other and are polarized in a thickness direction so as to accomplish the thickness mode vibration.

More specifically, polarization of the thick piezoelectric layer is directed in either an upper sense or a lower sense in the thickness direction while polarization of each thin piezoelectric layer is alternately directed in an upper or a lower sense in the thickness direction. In the high impedance portion, the lower electrode on the thick piezoelectric layer is connected to a first external terminal while the upper electrode on the thick piezoelectric layer is connected in common to the electrode attached to the lowermost thin piezoelectric layer and is grounded through a second external terminal. In the low impedance portion, every other electrode of the thin piezoelectric layers is electrically connected in common to a third external terminal while the remaining electrodes of the thin piezoelectric layers are also connected in common to a fourth external terminal which is grounded. The second and the fourth external terminals may be connected in common to each other.

From this fact, it is readily understood that the piezoelectric transformer unit has a three-terminal construction. With this structure, when an a.c. input voltage is given between the first and the second (or the fourth) external terminals, an a.c. output voltage is induced between the second or the fourth external terminal and the third external terminal, as mentioned in the referenced United States Patent. Accordingly, the proposed piezoelectric transformer unit serves to effectively transform the a.c. input voltage into the a.c. output voltage when it is excited in a resonance mode.

Eventually, the piezoelectric transformer unit is small in size and can improve a high frequency characteristic. However, neither suggestion nor consideration is made about application of such a piezoelectric transformer unit to any other circuits in the above-referenced United States Patent.

SUMMARY OF THE INVENTION

It is an object of this invention to provide a piezoelectric transformer circuit which is capable delivering a plurality of a.c. output voltages in response to a single a.c. input voltage by the use of a piezoelectric transformer unit as mentioned above.

It is another object of this invention to provide a piezoelectric transformer circuit of the type described, which is operable as a d.c./d.c. converter which includes the piezoelectric transformer unit.

It is still another object of this invention to provide a piezoelectric transformer circuit of the type described, which is capable of exciting the piezoelectric transformer unit in a resonance mode thereof.

A piezoelectric transformer circuit to which this invention is applicable comprises a piezoelectric transformer unit which is operable in a thickness extensional vibration mode and which comprises a piezoelectric block having first and second principal surfaces opposite to each other and a predetermined thickness defined between the first and the second principal surfaces, first and second electrode units on the first and the second principal surfaces, respectively, and a third electrode unit extended between the first and the second principal surface. According to a first aspect of this invention, the second electrode unit comprises a plurality of subdivided electrode members each of which has an area and which is laid on the second principal surface.

According to a second aspect of this invention, the piezoelectric block comprises a first partial piezoelectric block which provides the first principal surface and a first intermediate surface opposite to the first principal surface and which is polarized in a direction in a thickness direction between the first principal surface and the first intermediate surface, a second partial piezoelectric block which provides the second principal surface and a second intermediate surface opposite to the second principal surface and which comprises a plurality of piezoelectric layers stacked from an uppermost one to a lowermost one with at least one additional intermediate electrode interposed between two adjacent ones of the piezoelectric layers. The lowermost piezoelectric layer provides the second intermediate surface while the uppermost piezoelectric layer provides the second principal surface. In addition, the piezoelectric transformer block further comprises a third electrode unit interposed between the first and the second intermediate surfaces. The piezoelectric transformer unit comprises first and second transformer input terminals connected between the first and the third electrode units, respectively, and a plurality of transformer output terminal sets connected between the third electrode unit and the at least one additional intermediate electrode and between the third electrode unit and the second electrode unit.

According to a third aspect of this invention, a piezoelectric transformer circuit comprises a piezoelectric transformer unit which is operable in a thickness extensional vibration mode and which comprises a piezoelectric block having first and second principal surfaces opposite to each other and a predetermined thickness defined between the first and the second principal surfaces, first and second electrode units on the first and the second principal surfaces, respectively, and a third electrode unit extended between the first and the second principal surface. The first principal surface is divided into a first main area and a first subsidiary area partitioned from the first main area while the second principal surface is divided into a second main area and a second subsidiary area partitioned from the second main area. The first electrode unit comprises a first main electrode member deposited on the first main area, and a first subsidiary electrode member deposited on the first subsidiary area and electrically isolated from the first main electrode member. The second electrode unit comprises a second main electrode member deposited on the second main area and a second subsidiary electrode member deposited on the second subsidiary area and electrically isolated from the second main electrode member.

DESCRIPTION OF THE PREFERRED EMBODIMENTS

Figure 1:
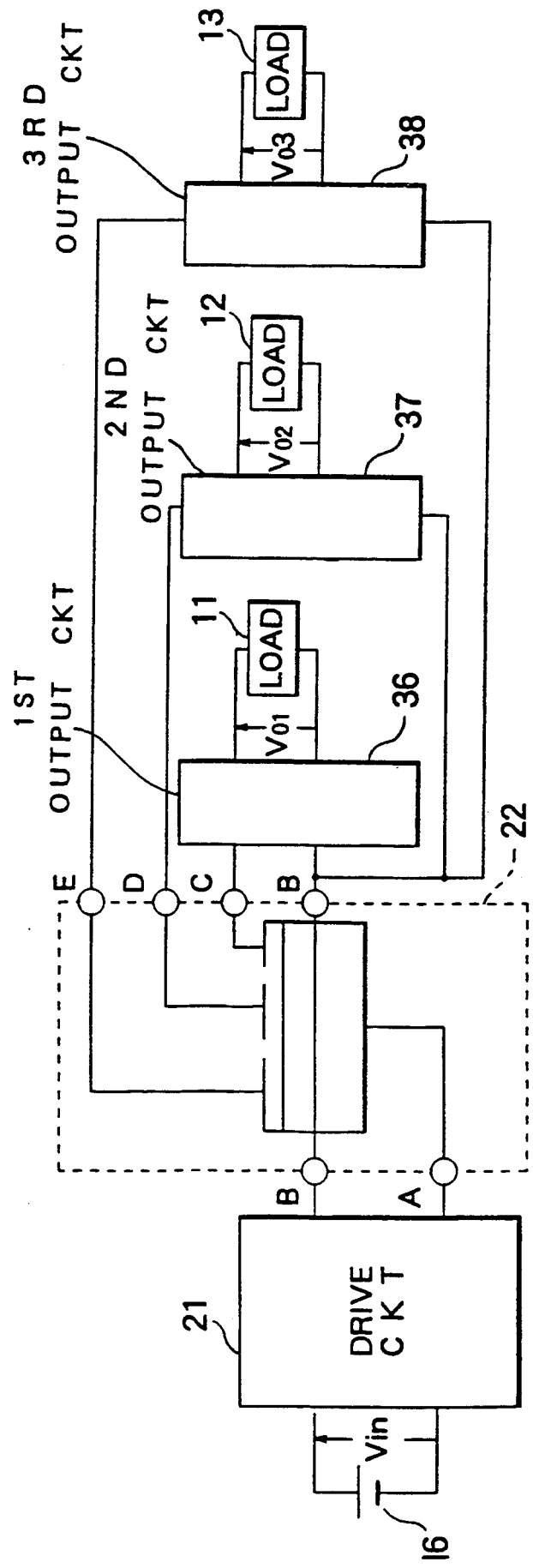
FIG. 1 is a block diagram of a piezoelectric transformer circuit according to a first embodiment of this invention.

Referring to FIG. 1, a piezoelectric transformer circuit according to a first embodiment of this invention is operable as a d.c./d.c. converter which serves to convert a d.c. input voltage Vin into a plurality of d.c. output voltages. In the illustrated example, first through third d.c. output voltages VO1, VO2 and VO3 are generated from the piezoelectric transformer circuit and supplied to first through third loads 11, 12, and 13 externally connected to the piezoelectric transformer circuit, respectively.

Specifically, the d.c. input voltage Vin is applied to the piezoelectric transformer circuit from a d.c. power source 16 represented by a battery in FIG. 1. In the piezoelectric transformer circuit, a driver circuit 21 is operable in response to the d.c. input voltage Vin to transform the d.c. input voltage Vin into an a.c. voltage. The a.c. voltage is supplied to a piezoelectric transformer unit 22 as an a.c. input voltage or an a.c. transformer input voltage. The piezoelectric transformer unit 22 has first and second transformer input terminals depicted at A and B and four transformer output terminals in the illustrated example. Among the four transformer output terminals, one of them is connected in common to the second transformer input terminal B and is therefore depicted at B, as shown in FIG. 1. At any rate, the one transformer output terminal B may be regarded as being grounded together with the second input transformer terminal B and may be referred to as a first transformer output terminal. In this connection, the remaining transformer output terminals depicted at C, D, and E will be called second, third, and fourth transformer output terminals, respectively.

Briefly, when the a.c. input voltage is applied between the first and the second transformer input terminals A and B, first, second, and third a.c. transformer output voltages are developed between the first and the second transformer output terminals B and C, between the first and the third transformer output terminals B and D, and between the first and the fourth transformer Output terminals B and E, respectively.

Figure 2:
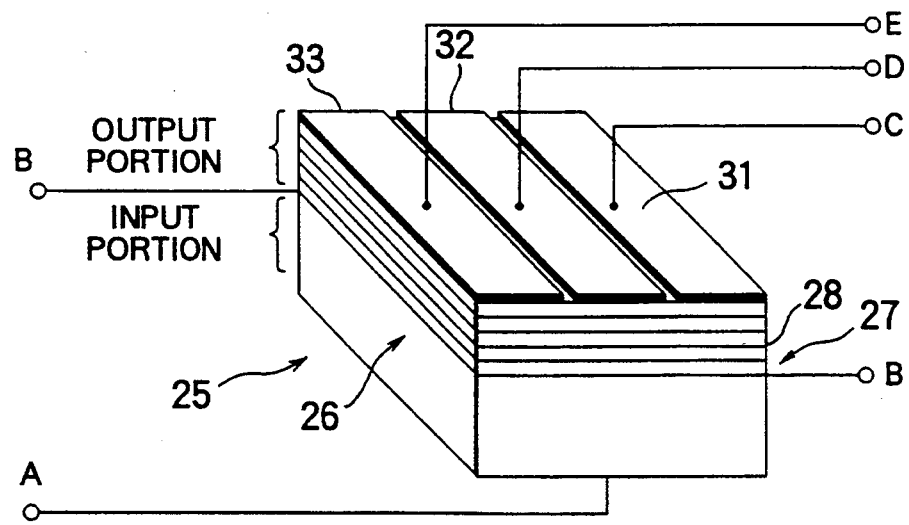
FIG. 2 is a perspective view of a piezoelectric transformer unit used in the piezoelectric transformer circuit illustrated in FIG. 1.

Referring to FIG. 2 in addition to FIG. 1, the piezoelectric transformer unit 22 is divisible into an input portion and an output portion, as illustrated in FIG. 2 and operable in a thickness extensional vibration mode. Specifically, the piezoelectric transformer unit 22 comprises a piezoelectric block 25 which has first and second principal surfaces opposite to each other. In the example being illustrated, the first principal surface is directed downwards as viewed in FIG. 2 while the second principal surface is directed upwards as viewed in FIG. 2.

The piezoelectric block 25 comprises a first partial piezoelectric block or portion 26 and a second partial piezoelectric block or portion 27 which provide the first and the second principal surfaces, respectively. First and second electrode units are formed on the first and the second principal surfaces in a manner to be described later, respectively, and may be composed of aluminum.

Herein, the first partial piezoelectric block 26 has a first intermediate surface opposite to the first principal surface, a thickness of, for example, 1.08 mm between the first intermediate surface and the first principal surface, a length of, for example, 4.5 mm, and a width of, for example, 3.5 mm and is polarized, for instance, in an upward sense in a thickness direction. The first electrode unit is coated on a whole of the first principal surface without being divided and may be called a first electrode layer. Likewise, a primary intermediate electrode unit is coated on a whole of the first intermediate surface and may be referred to as a primary intermediate electrode layer.

On the other hand, the second partial piezoelectric block 27 has the second principal surface, as mentioned before, and a second intermediate surface directed to the first intermediate surface and brought into contact with the primary intermediate electrode layer together with the first intermediate surface of the first partial piezoelectric block 26.

From the above, it is readily understood that the second transformer input terminal B and the first transformer output terminal B are electrically connected to the primary intermediate electrode layer.

Furthermore, the second partial piezoelectric block 27 comprises first through fifth piezoelectric layers stacked on the first partial piezoelectric block 26 through the primary intermediate electrode layer from a lowermost one to an uppermost one, with internal electrode layers (collectively indicated by 28) interposed between two adjacent ones of the first through the fifth piezoelectric layers. In the illustrated example, the lowermost and the uppermost piezoelectric layers form the first and the fifth piezoelectric layers, respectively. Each of the first through the fifth piezoelectric layers has a thickness of, for example, 0.2 mm and is alternatively polarized upwards or downwards of FIG. 2. In this connection, every other piezoelectric layer is polarized in the same direction while two adjacent ones of the first through the fifth piezoelectric layers are polarized in opposite directions. It is assumed that the first piezoelectric layer is polarized in the downwards of FIG. 2.

Now, it is to be noted in FIG. 2 that the second electrode unit which is attached to the second principal surface of the second partial piezoelectric block 27 is divided along a length direction of the piezoelectric block 25 into first through third subdivided electrode members 31, 32, and 33 which are electrically isolated from one another and from which the second, the third, and the fourth transformer output terminals C, D, and E, are extracted, as shown in FIG. 2.

With this structure, the first through the third a.c. transformer output voltages are induced between the first and the second transformer output terminals B and C, between the first and the third transformer output terminals B and D, and between the first and the fourth transformer output terminals B and E, respectively, as mentioned before, and are identical with one another. Each of the first through the third a.c. transformer output voltages is equal to one-fifth of the a.c. input voltage supplied across the first and the second transformer input terminals A and B. In addition, electric power derived from the second through the fourth transformer terminals C to E is proportional to areas of the first through the third subdivided electrode members 31 to 33. Therefore, it is possible that various kinds of electric circuits which have different power capacities can be connected to the illustrated piezoelectric transformer unit 25.

Referring back to FIG. 1, the piezoelectric transformer circuit comprises first, second, and third output circuits 36, 37, and 38 between the first and the second transformer output terminals B and C, between the first and the third transformer output terminals B and D, and between the first and the fourth transformer output terminals B and E, respectively. Each of the first through the third output circuits 36, 37, and 38 may be structured by a combination of a rectifying circuit and a smoothing circuit and is operable to convert each of the first through the third a.c. transformer output voltages into the first through the third d.c. output voltages Vol to VO3. Thus, the illustrated piezoelectric transformer circuit can deliver a plurality of d.c. output voltages, such as VO1 to VO3, to a plurality of loads, such as 11 to 13.

Figure 3:
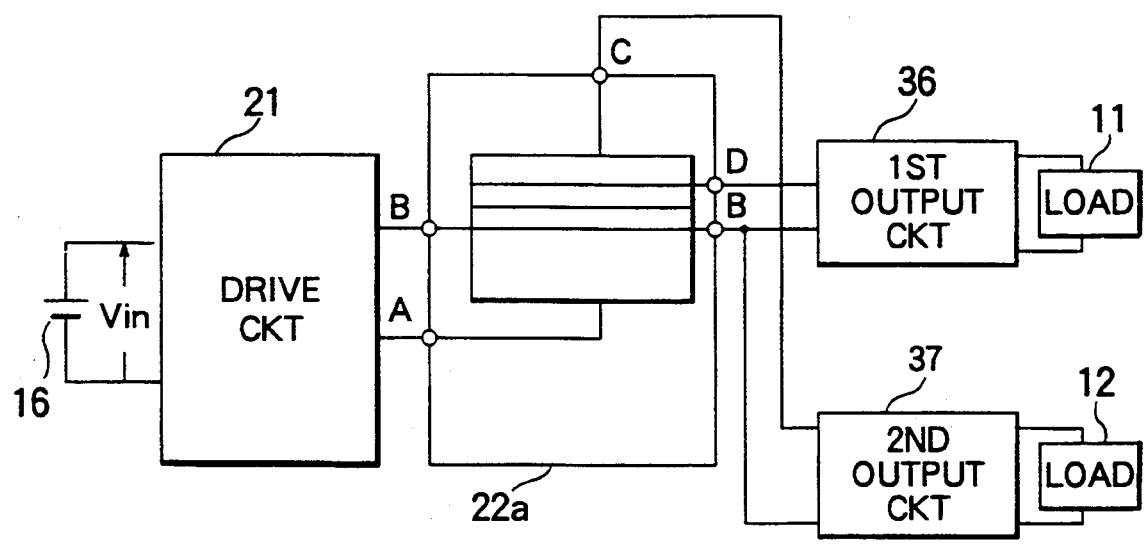
FIG. 3 is a block diagram of a piezoelectric transformer circuit according to a second embodiment of this invention.

Referring to FIG. 3, a piezoelectric transformer circuit according to a second embodiment of this invention is operable as a d.c./d.c. converter like in FIGS. 1 and 2 but comprises a piezoelectric transformer unit which is somewhat different from that illustrated in FIGS. 1 and 2 and which will be depicted at 22a. Specifically, the illustrated piezoelectric transformer unit 22a has first and second transformer input terminals A and B and a plurality of transformer output terminals like the piezoelectric transformer unit 22 shown in FIGS. 1 and 2. In the illustrated example, only three of the transformer output terminals are extracted from the illustrated piezoelectric transformer unit 22a and may therefore be called first, second, and third transformer output terminals designated by B, C, and D, like in FIGS. 1 and 2. As mentioned in conjunction with FIG. 1, the first transformer output terminal B is electrically grounded in common to the second transformer input terminal B.

With this structure, the d.c. input voltage is converted into an a.c. transformer input voltage by the drive circuit 21 to be supplied between the first and the second transformer input terminals A and B. The a.c. transformer input voltage is transformed by the piezoelectric transformer unit 22a into first and second a.c. transformer output voltages which are converted into the first and the second d.c. output voltages VO1 and VO2 by first and second output circuits 36 and 37 to be supplied to loads 11 and 12. Each of the first and the second output circuits 36 and 37 is similar to that described with reference to FIG. 1 and may be a combination of a rectifying circuit and a smoothing circuit both of which are known in the art.

Figure 4:
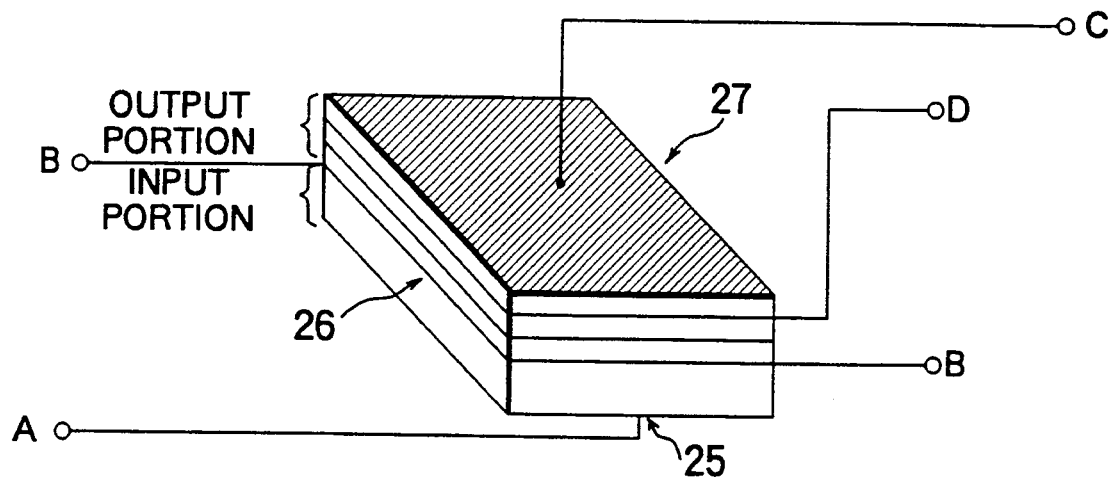
FIG. 4 is a perspective view of a piezoelectric transformer unit used in the piezoelectric transformer circuit illustrated in FIG. 3.

Referring to FIG. 4 together with FIG. 3, the piezoelectric transformer unit 22a is divisible into input and output portions, as illustrated in FIG. 2 Like in FIGS. 1 and 2, the piezoelectric transformer unit 22a comprises a piezoelectric block 25 divided into first and second partial piezoelectric blocks 26 and 27. However, it is noted as regards the illustrated piezoelectric transformer unit 22a that only first through third piezoelectric layers are stacked on one another with internal electrode layers interposed therebetween and that the second electrode unit on the second principal surface is not divided into a plurality of subdivided electrode members, which differs from that illustrated in FIG. 2.

As readily understood from FIG. 4, the second transformer input terminal B and the first transformer output terminal B are electrically connected to and extracted from the primary intermediate electrode unit, like in FIG. 2 while the second and the third transformer output terminals C and D are electrically connected to and extracted from the second electrode unit and the internal electrode unit interposed between second and third ones of the piezoelectric thin layers sandwiched within the second partial piezoelectric block 27. Thus, the first and the second a.c. transformer output voltages are developed across the first transformer output terminal B and the second transformer output terminal C and across the first transformer output terminal B and the third transformer output terminal D, respectively. In the example, the first a.c. transformer output voltage is different from or lower than the second a.c. transformer output voltage. The remaining structure and operation are similar to those illustrated in FIGS. 1 and 2 and will not be mentioned any longer.

Figure 5:
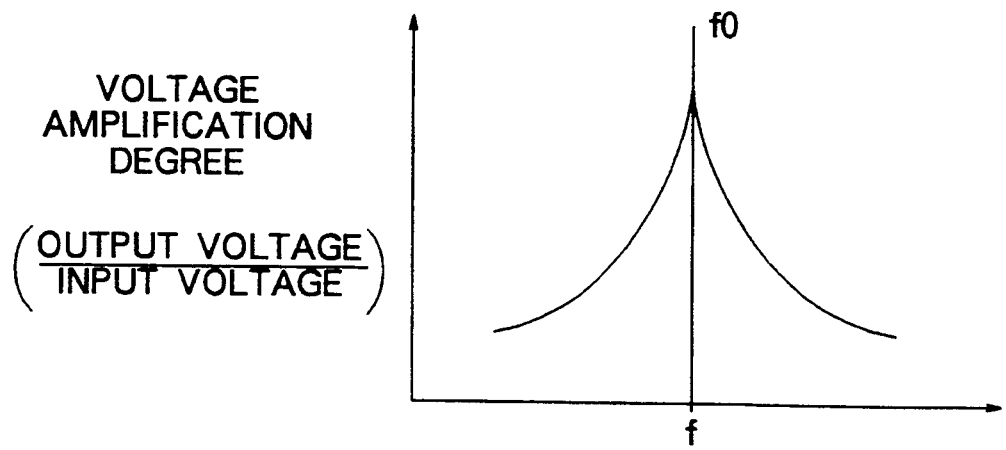
FIG. 5 shows a graphical representation for use in describing a characteristic of a piezoelectric transformer unit.

Temporarily referring to FIG. 5, illustration is made about a characteristic of a general piezoelectric transformer unit. In FIG. 5, a voltage amplification degree and a frequency f are taken along an ordinate and an abscissa, respectively. The voltage amplification degree is defined by a ratio of an a.c. transformer output voltage to an a.c. transformer input voltage. As shown in FIG. 5, it is known in the art that the piezoelectric transformer unit has generally a resonance frequency $f_0$ determined by a thickness d of the piezoelectric transformer unit and exhibits a maximum voltage amplification degree at the resonance frequency, as readily understood from FIG. 5. Accordingly, it is preferable that the piezoelectric transformer unit is driven by the resonance frequency $f_0$.

Figure 6:
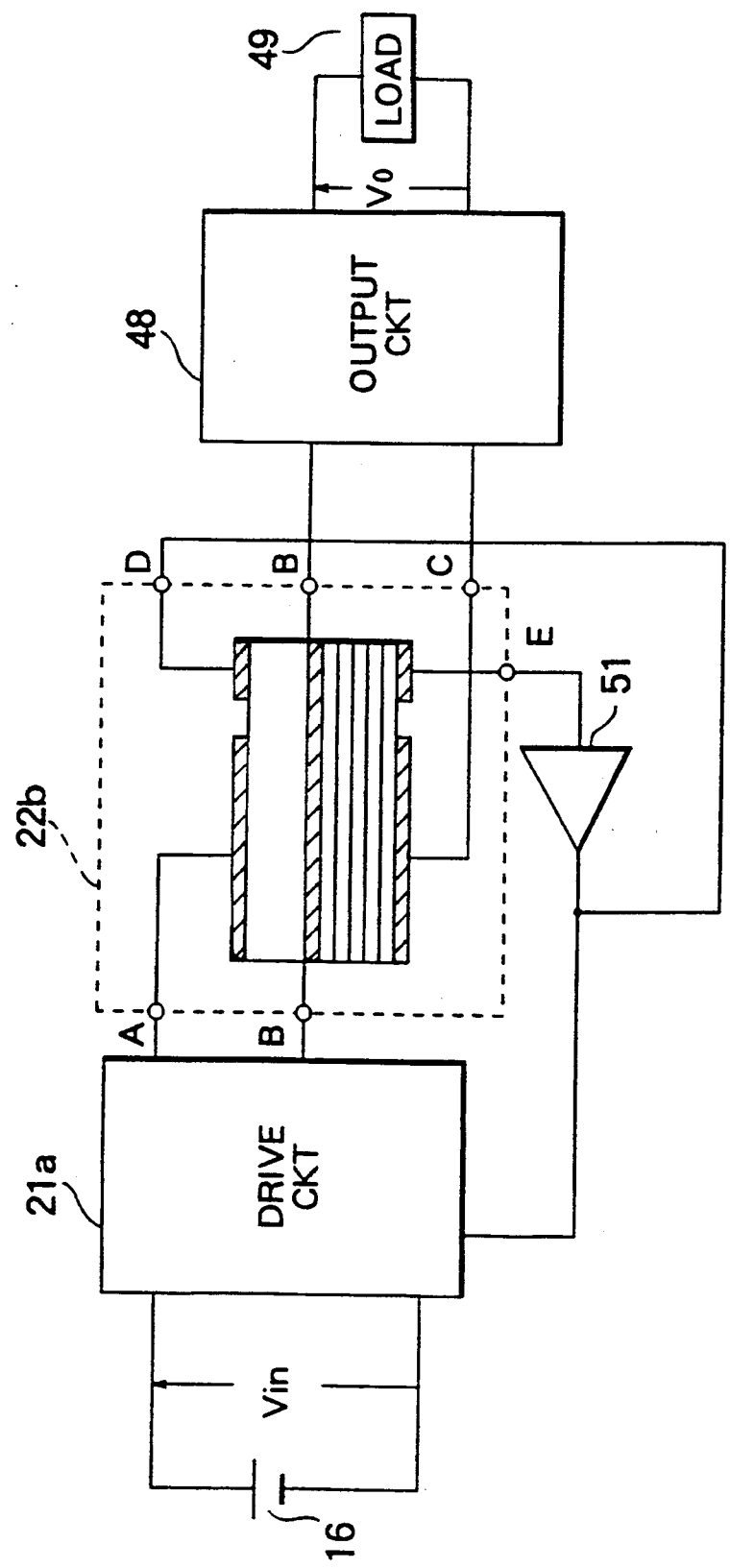
FIG. 6 is a block diagram of a piezoelectric transformer circuit according to a third this invention.
Figure 7:
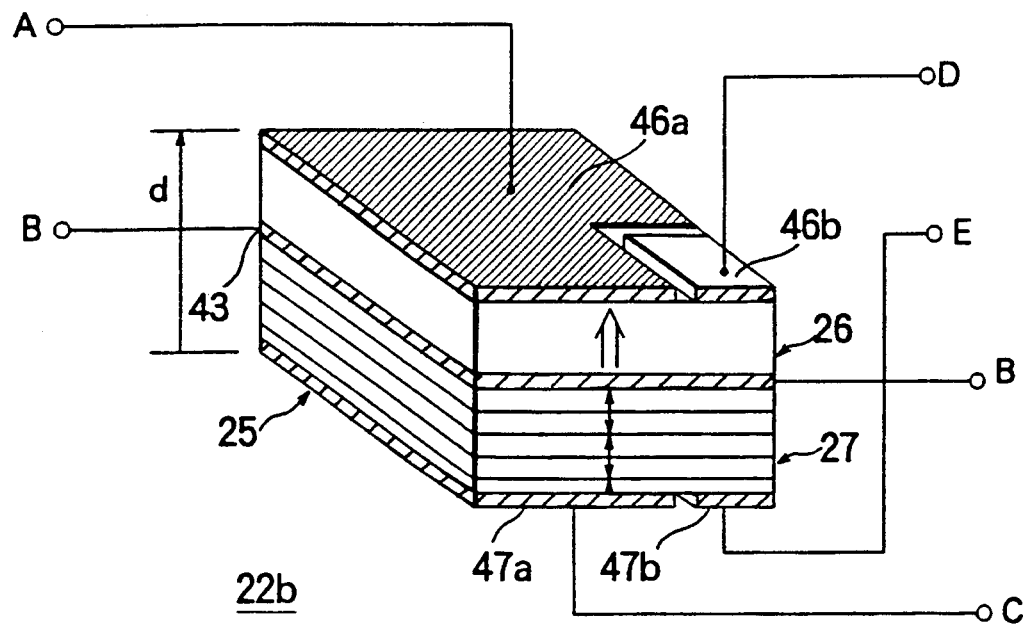
FIG. 7 is a perspective view of a piezoelectric transformer unit illustrated in FIG. 6.

Referring to FIGS. 6 and 7, a piezoelectric transformer circuit according to a third embodiment of this invention comprises a driver circuit 21a which has a synchronization terminal in addition to d.c. input terminals and a.c. output terminals and which is synchronously operated in accordance with synchronization signal given through the synchronization terminal. As a result, a d.c. input voltage Vin is converted into an a.c. driver output voltage which is synchronized with the synchronization signal and which is supplied to a piezoelectric transformer unit 22b as an a.c. input voltage or an a.c. transformer input voltage. The synchronization signal is sent to the drive circuit 21a in a manner to be described later. Such a driver circuit 21a is well known in the art and will therefore not be described any longer.

At any rate, the a.c. driver output signal is supplied from the drive circuit 21a to the piezoelectric transformer unit 22b illustrated in FIG. 7.

In FIG. 7, the illustrated piezoelectric transformer unit 22b has a predetermined thickness d of, for example, about 2.1 mm and comprises a piezoelectric block 25 having first and second principal surfaces directed upwards and downwards of FIG. 7, respectively. From this fact, it is readily understood that the piezoelectric transformer unit 22b in FIG. 7 is upset relative to the piezoelectric transformer unit 22 illustrated in FIG. 2.

The piezoelectric block 25 comprises first and second partial piezoelectric blocks 26 and 27 which are stacked together like in FIG. 2 and which provides the first and the Second principal surfaces, respectively. As shown in FIG. 7, the first piezoelectric block 26 is composed of a single or thick piezoelectric member polarized upwards of FIG. 7 while the second partial piezoelectric block 27 comprises first through fifth thin piezoelectric layers which are alternatively polarized in the illustrated manner and which are united with one another through internal electrodes which may be called additional intermediate or internal electrodes. Each of the first through the fifth piezoelectric layers may have a thickness of, for example, 0.2 mm.

Between the first and the second partial piezoelectric blocks 26 and 27 is interposed a primary intermediate electrode unit 43 which is electrically connected to the second transformer input terminal B, namely, the second transformer output terminal B.

In the example being illustrated, the first principal surface of the first partial piezoelectric block 26 is divided into a first main area and a first subsidiary area partitioned from the first main area. Likewise, the second principal surface of the second partial piezoelectric block 27 is also divided into a second main area and a second subsidiary area partitioned from the second main area.

A first main electrode member 46a is coated on the first main area of the first principal surface while a first subsidiary electrode member 46b is coated on the first subsidiary area and is electrically isolated from the first main electrode member 46a. A combination of the first main electrode member 46a and the first subsidiary electrode member 46b may be referred to as a first electrode unit.

Similarly, a second main electrode member 47a and a second subsidiary electrode member 47b are coated on the second main area and the second subsidiary area, respectively, with the second main electrode member 47a electrically isolated from the second subsidiary electrode member 47b. A combination of the second main electrode member 47a and the second subsidiary electrode member 47b may be called a second electrode unit. In this connection, the primary intermediate electrode unit 43 may be called a third electrode unit.

Herein, it is to be noted that the first and the second subsidiary electrode members 46b and 47b serve to induce self-excited vibration, as will become clear as the description proceeds, and are narrower in area than the first and the second main electrode members 46a and 47a, as illustrated in FIG. 7.

Furthermore, the first and the second transformer input terminals A and B are electrically connected to the first main electrode member 46a and the third electrode unit 43, respectively, while the first transformer output terminal B and the second transformer output terminal C are connected to the third electrode unit and the second main electrode member 47a, respectively. The third and the fourth transformer output terminals D and E are electrically connected to the first and the second subsidiary electrode members 46b and 47b, respectively.

Turning back to FIG. 6, the first and the second transformer output terminals B and C are connected to an output circuit 48 which may be a combination of a rectifying circuit and a smoothing circuit, as mentioned in conjunction with FIGS. 1 and 3. As a result, an a.c. transformer output voltage is developed across the first and the second transformer output terminals B and C to be sent to a load 49 as a d.c. output voltage Vo.

On the other hand, the fourth transformer output terminal E is connected to an inverter circuit 51 which is operable to invert a polarity of an a.c. internal voltage induced on the second subsidiary electrode member 47b and to produce a subsidiary voltage having an inverted polarity relative to the a.c. internal voltage. The subsidiary voltage is fed back to the first subsidiary electrode member 46b through the third transformer output terminal D on one hand and is delivered to the drive circuit 21a as the synchronization signal which serves to control a frequency of the drive circuit 21a and which will be named a control signal. The inverter 51 may be called a subsidiary voltage producing circuit along with connections between the inverter 51 and the driver circuit 21a and between the inverter 51 and the first subsidiary electrode member 46a.

Feedback operation of the subsidiary voltage to the first subsidiary electrode member 46b induces the self-excited vibration in the piezoelectric transformer unit. Inasmuch as the self-excited vibration has a frequency equal to the resonance frequency determined by the thickness d of the piezoelectric transformer unit, the illustrated piezoelectric transformer unit vibrates at the resonance frequency.

Figure 8:
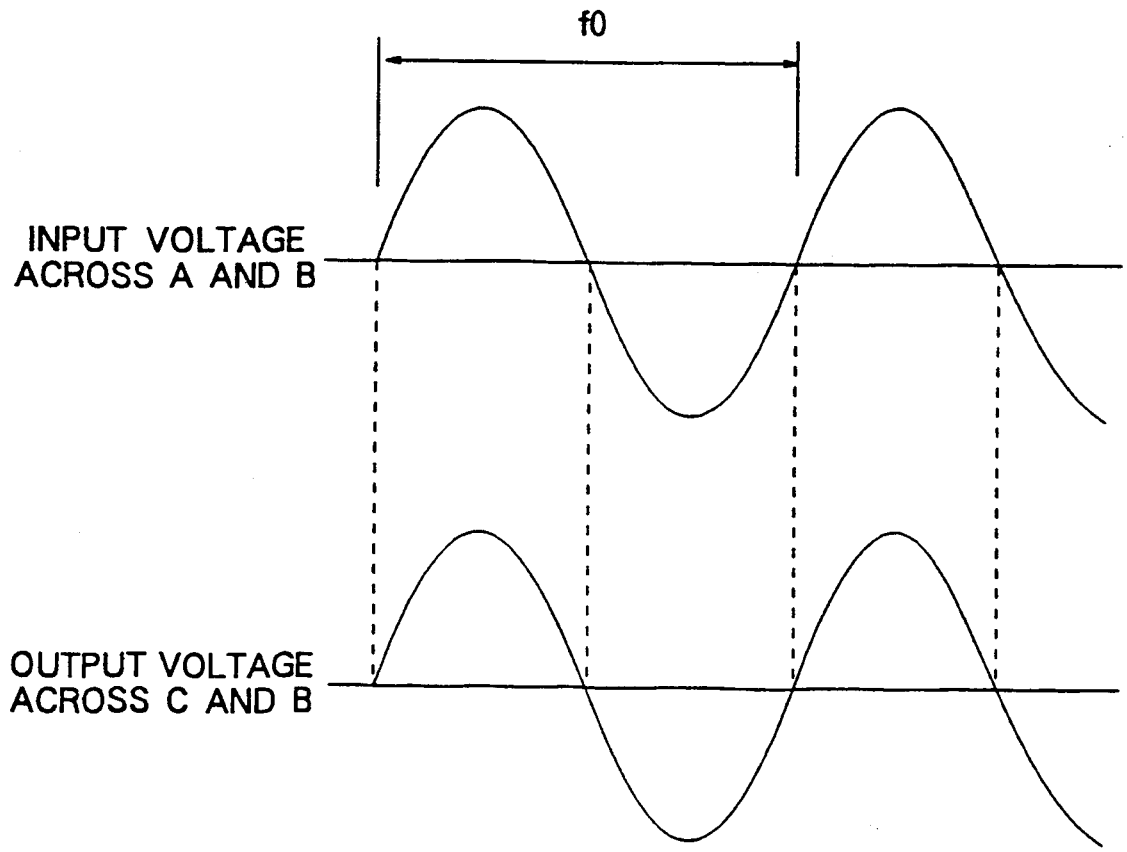
FIG. 8 shows waveforms for use in describing operation of the piezoelectric transformer circuit illustrated in FIG. 6.

With this structure, the a.c. transformer input voltage across the first and the second transformer input terminals A and B has the same resonance frequency $f_0$ as the subsidiary voltage across the first and the second transformer output terminals B and C, as shown in FIG. 8. This means that the illustrated piezoelectric transformer circuit is operated at a high efficiency, as readily understood from FIG. 5, and can therefore produce a maximum transformer output voltage.

Figure 9:
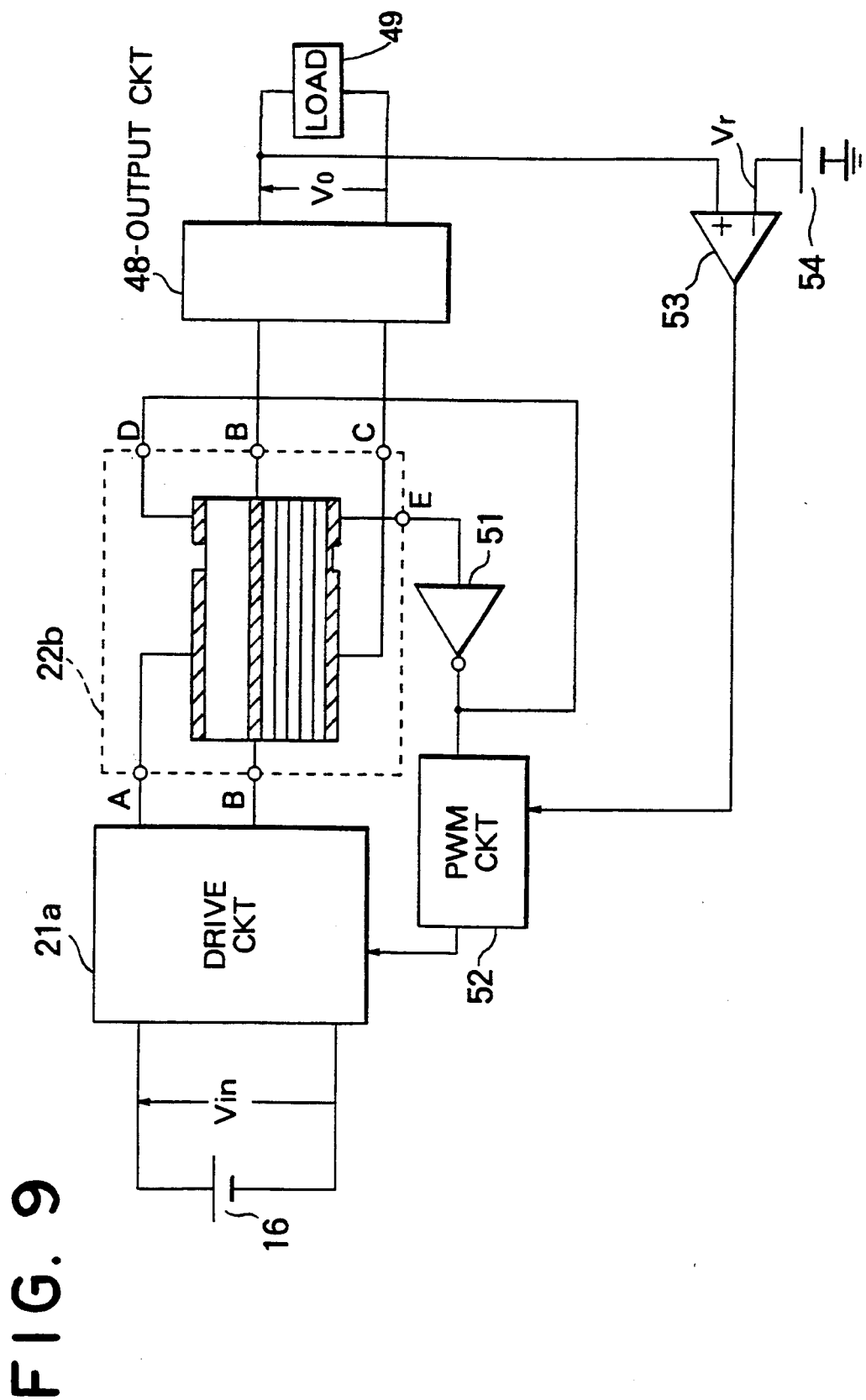
FIG. 9 is a block diagram of a piezoelectric transformer circuit according to a fourth embodiment of this invention.

Referring to FIG. 9, a piezoelectric transformer circuit according to a fourth embodiment of this invention is similar in structure to that illustrated in FIG. 6 except that a pulse width modulation (PWM) circuit 52 is interposed between the inverter 51 and the drive circuit 21a and is controlled by a comparator 53 supplied from the output circuit 48 with the d.c. output voltage Vo.

More specifically, the comparator 53 compares the d.c. output voltage Vo with a reference voltage Vr sent from a reference voltage source 54 to produce an error signal which is representative of a difference between the d.c. output voltage Vo and the reference voltage Vr and which may be named a local control signal. Supplied with the error signal and the subsidiary signal delivered from the inverter 51, the PWM circuit 52 carries out pulse width modulation of the subsidiary signal in accordance with the error signal and produces a pulse width modulated signal which may be a sequence of pulses. In this event, each of the pulses has a frequency identical with that of the resonance frequency of the piezoelectric transformer unit 22b and a pulse width controlled by the local control signal.

Figure 10:
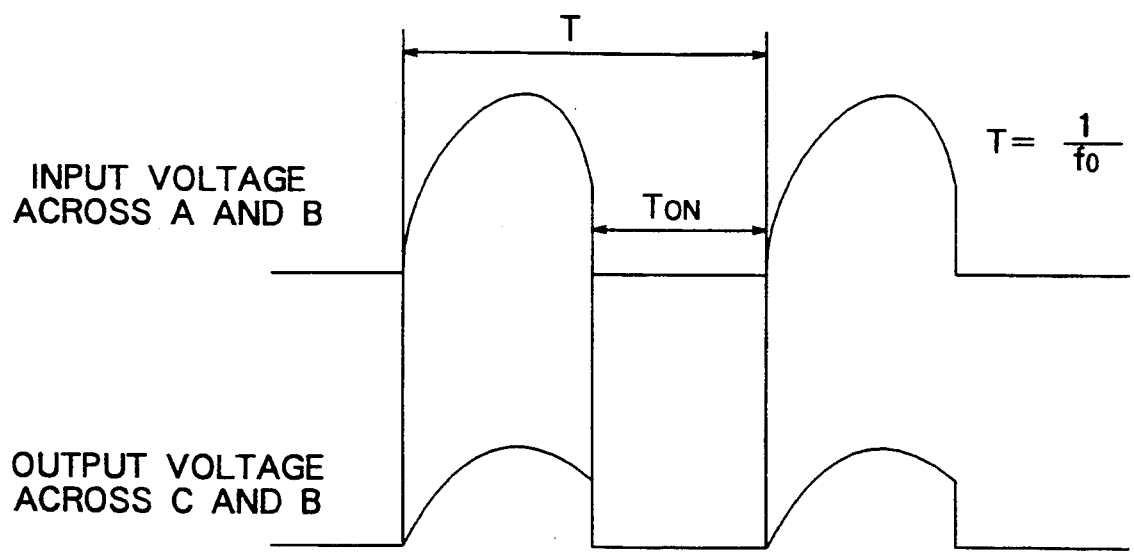
FIG. 10 shows waveforms for use in describing operation of the piezoelectric transformer circuit illustrated in FIG. 9.

The pulse width modulated signal is delivered as the control signal from the PWM circuit 52 to the drive circuit 21a. As a result, an a.c. output signal supplied from the illustrated drive circuit 21a between the first and the second transformer input terminals A and B of the piezoelectric transformer unit 22b as the a.c. input signal of the transformer unit 22b, as illustrated along a first line in FIG. 10. The resultant a.c. transformer output signal is induced between the first and the second transformer output terminals B and C, as illustrated along a second line of FIG. 10.

With this structure, it is possible to generate the a.c. transformer output voltage which is accurately synchronized with the resonance frequency of the piezoelectric transformer unit 22b.

While this invention has thus far been described in conjunction with several embodiments thereof, it will be readily possible for those skilled in the art to put this invention into practice in various other manners. For example, a plurality of d.c. output voltages may be generated in FIGS. 6 and 9. In addition, the control signal is supplied to the drive circuit in FIGS. 1 and 3.

What is claimed is:

1. A piezoelectric transformer circuit comprising:
a piezoelectric transformer unit which is operable in a thickness extensional vibration mode and which comprises a piezoelectric block having first and second principal surfaces opposite to each other and a predetermined thickness defined between said first and said second principal surfaces, first and second electrode units on said first and said second principal surfaces, respectively, and a third electrode unit extended between said first and said second principal surface,
said second electrode unit comprising:
a plurality of subdivided electrode members each of which has an area and which is laid on said second principal surface.

2. A piezoelectric transformer circuit as claimed in claim 1, wherein each area of said subdivided electrode members is different from one another.

3. A piezoelectric transformer circuit as claimed in claim 1, wherein each area of said subdivided electrode members is identical with one another.

4. A piezoelectric transformer circuit as claimed in claim 1, said piezoelectric transformer circuit producing a plurality of d.c. output voltages, said piezoelectric transformer circuit further comprising:
driving means connected between said first and said third electrode units for supplying an a.c. input voltage between said first and said third electrode units to drive said piezoelectric transformer unit by said a.c. input voltage and to develop a plurality of a.c. output voltages between said third electrode unit and said subdivided electrode members, respectively; and
a plurality of output means, each being connected between said third electrode unit and each of said subdivided electrode members for converting each of said a.c. output voltages into each of said d.c. output voltages.

5. A piezoelectric transformer circuit as claimed in claim 1, said piezoelectric transformer circuit producing a plurality of d.c. output voltages, wherein said piezoelectric block comprises:
a first partial piezoelectric block which provides said first principal surface and a first intermediate surface opposite to said first principal surface and which is polarized in a direction perpendicular to both said first principal surface and said first intermediate surface;
a primary intermediate electrode unit deposited on said first intermediate surface as said third electrode unit;
a second partial piezoelectric block which provides said second principal surface and a second intermediate surface attached to said primary intermediate electrode and which comprises a plurality piezoelectric layers which are stacked from a lowermost one to an uppermost one with at least one additional intermediate electrode interposed between two adjacent ones of said piezoelectric layers, said lowermost piezoelectric layer being attached to said primary intermediate electrode unit while said uppermost piezoelectric layer provides said second principal surface;
driving means connected between said first and said third electrode units for supplying an d.c. input voltage between said first and said third electrode units to drive said first piezoelectric partial block by said a.c. input voltage and to develop a plurality of output voltages between said third electrode unit and said at least one additional intermediate electrode and between said third electrode unit and said second electrode unit; and
a plurality of rectifying means, each being connected between said third electrode unit and said at least one additional intermediate electrode and between said third electrode unit and said second electrode unit for rectifying each of said a.c. output voltages to produce a rectified voltage as each of said d.c. output voltages.

6. A piezoelectric transformer circuit comprising:

(A) a piezoelectric transformer unit which is operable in a thickness extensional vibration mode and which comprises:
1) a piezoelectric block having first and second principal surfaces opposite to each other and a predetermined thickness defined between said first and said second principal surfaces, said first principal surface being divided into a first main area and a first subsidiary area partitioned from said first main area, said second principal surface being divided into a second main area and a second subsidiary area partitioned from said second main area,
2) first electrode unit on said first principal surface, said first electrode unit comprising:
   (a) a first main electrode member deposited on said first main area; and
   (b) a first subsidiary electrode member deposited on said first subsidiary area and electrically isolated from said first main electrode member;
   (c) said second electrode unit comprising:
3) a second electrode unit on said second principal surface, second electrode unit comprising:
   (a) a second main electrode member deposited on said second main area; and
   (b) a second subsidiary electrode member deposited on said second subsidiary area and electrically isolated from said second main electrode member;
4) a third electrode unit extended between said first and said second principal surface;
(B) controllable driving means connected between said first electrode unit and said third electrode unit and operable in response to a control signal for supplying an a.c. input voltage between said first main electrode member and said third electrode units to develop an a.c. internal voltage across said second main electrode member and said third electrode unit as a function of said control signal;
(C) output means connected between said second main electrode member and said third electrode unit for converting the a.c. internal voltage between said second main electrode member and said third electrode unit into said d.c. output voltage;
(D) subsidiary voltage producing means connected to both said first and said second subsidiary electrode members for producing a subsidiary voltage which is induced through said first subsidiary electrode member by said a.c. internal voltage and which has a predetermined frequency determined by the thickness of said piezoelectric transformer unit; and
(E) control signal supplying means for supplying said subsidiary voltage to said controllable driving means as said control signal.

7. A piezoelectric transformer circuit as claimed in claim 6, wherein said subsidiary voltage producing means comprises:
an inverter circuit connected to said first subsidiary electrode member for inverting a polarity of the subsidiary voltage to produce an inverted voltage; and
delivering means for delivering said inverted voltage to said second subsidiary electrode member;
said control signal producing means comprising:
delivery means for delivering said inverted voltage to said controllable driving means as said control signal.

8. A piezoelectric transformer circuit as claimed in claim 6, wherein said subsidiary voltage producing means comprises:
an inverter circuit connected to said first subsidiary electrode member for inverting a polarity of the subsidiary voltage to produce an inverted voltage; and
delivering means for delivering said inverted voltage to said second subsidiary electrode member;
said control signal producing means comprising:
means supplied with said d.c. output voltage for producing a local control signal dependent on said d.c. output voltage;
pulse width modulating means supplied with said inverted voltage and said local control signal for producing a pulse width modulated signal having a pulse width determined by said local control signal by carrying out pulse width modulation of said inverted voltage by said local control signal; and
delivery means for delivering said pulse width modulated signal to said driving means as said control signal.

* * * * *